(12) United States Patent
Wells et al.

(10) Patent No.: US 8,442,083 B2
(45) Date of Patent: *May 14, 2013

(54) SYSTEMS AND METHODS FOR STABILIZING LASER FREQUENCY BASED ON AN ISOCLINIC POINT IN THE ABSORPTION SPECTRUM OF A GAS

(75) Inventors: Nathan P. Wells, Marina Del Rey, CA (US); James C. Camparo, Redondo Beach, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/281,323

(22) Filed: Oct. 25, 2011

(65) Prior Publication Data

US 2012/0039348 A1     Feb. 16, 2012

Related U.S. Application Data

(63) Continuation of application No. 12/702,991, filed on Feb. 9, 2010, now Pat. No. 8,050,301.

(51) Int. Cl.
*H01S 3/13* (2006.01)
(52) U.S. Cl. .................. 372/32; 372/20; 372/29.011
(58) Field of Classification Search ............... 372/32
See application file for complete search history.

(56) References Cited

U.S. PATENT DOCUMENTS

| | | | |
|---|---|---|---|
| 4,833,681 A | 5/1989 | Akiyama et al. | |
| 5,392,303 A | 2/1995 | Shiozawa et al. | |
| 5,553,087 A | 9/1996 | Telle | |
| 6,151,340 A | 11/2000 | Rivers | |
| 8,050,301 B2 * | 11/2011 | Wells et al. ................ | 372/32 |

OTHER PUBLICATIONS

Affolderbach et al., "A compact laser head with high-frequency stability for Rb atomic clocks and optical instrumentation," Review of Scientific Instruments 76, 073108, 5 pages (2005).
Furuta et al., "Evaluations of frequency shift and stability in rubidium vapor stabilized semiconductor lasers," Applied Optics 28(17), 3737-3743 (Sep. 1, 1989).
International Union of Pure and Applied Chemistry (IUPAC), "Glossary of terms used in photochemistry," Pure & Appl. Chem. 68(12), 4 pages (1996).
Schawlow, "Spectroscopy in a new light," Reviews of Modern Physics 54(3), 13 pages (Jul. 1982).
Tetu et al., "Toward the realization of a wavelength standard at 780 nm based on a laser diode frequency locked to rubidium vapor," IEEE Transactions on Instrumentation and Measurement 40(2), 191-195 (Apr. 1991).

(Continued)

*Primary Examiner* — Xinning Niu
(74) *Attorney, Agent, or Firm* — Jones Day; Jaime D. Choi

(57) ABSTRACT

Systems and methods for stabilizing laser frequency based on an isoclinic point of an atomic or molecular medium are provided herein. A system may include: a transmission cell containing a gas and configured to transmit light from the laser, the gas having an absorption spectrum with an isoclinic point; a photodiode generating an output based on an amplitude of transmitted laser light; and circuitry configured to tune the frequency of the laser to the isoclinic point of the absorption spectrum based on the output. The absorption spectrum may have first and second overlapping peaks respectively corresponding to first and second transitions of the gas, the isoclinic point being a saddle point between the first and second peaks. The first and second peaks may have substantially equal amplitude as one another and/or may broaden substantially equally as each other as a function of a physical parameter of the gas.

20 Claims, 10 Drawing Sheets

OTHER PUBLICATIONS

Weel et al., "Laser-frequency stabilization using a lock-in amplifier," Can. J. Phys. 80, 1449-1458 (2002).

Whiting, "An empirical approximation to the Voigt profile," J. Quant. Spectrosc. Radiat. Transfer 8, 1379-1384 (1968).

USPTO, Non-Final Office Action for U.S. Appl. No. 12/702,991, 11 pages, mailed Mar. 3, 2011.

* cited by examiner

SYSTEMS AND METHODS FOR STABILIZING LASER FREQUENCY BASED ON AN ISOCLINIC POINT IN THE ABSORPTION SPECTRUM OF A GAS

CROSS-REFERENCE TO RELATED APPLICATIONS

This application is a continuation under 35 U.S.C. §120 of U.S. patent application Ser. No. 12/702,991, filed Feb. 9, 2010 now U.S. Pat. No. 8,050,301, the entire contents of which are incorporated by reference herein.

STATEMENT OF GOVERNMENT INTEREST

This invention was made with government support under Contract No. N66001-09-C-2058 awarded by DARPA. The government has certain rights in the invention.

FIELD

This application generally relates to systems and methods for stabilizing the frequency of a laser based on a feature in the absorption spectrum of a gas.

RELATED ART

As is known to those of skill in the art, the frequency of light generated by a laser may change over time. For example, changes in temperature may change the cavity length of the laser, or variations in the driver current of diode lasers may cause the frequency to change rapidly. Because of such variations, it may be useful to stabilize the frequency in certain systems.

One system in which frequency stabilization may be useful is ultraminiature atomic physics (UAP), in which diode lasers are routinely used for spectroscopy and/or optical pumping. The chip-scale atomic clock and the chip-scale atomic magnetometer are examples of UAP systems. Such systems are based on precision spectroscopy aimed at generating and accurately probing an atomic interaction over millimeter or smaller scales. One constraint for such systems, however, is that their overall size and power may be severely constrained. Moreover, the atomic phenomena may occur under physical conditions that may bring new and sometimes significant dimensions to the atomic physics as compared to macroscopic laboratory experiments. As such, the stability of the laser frequency in some circumstances may be critical, not only because variations in frequency yield variations in the spectroscopic signals of interest, but also because shifts in laser frequency may alter the atoms' energy level structure through the light-shift effect (e.g., the ac Stark shift).

In UAP, as well other types of laser-based systems, the laser frequency may be stabilized by locking the laser to an absorption line of an atomic gas. FIG. 1 schematically illustrates a prior art system 10 for stabilizing the frequency of a laser by locking the laser to an atomic absorption line. System 10 includes laser 11, gas cell 12, photodiode (PD) 13, and controller circuitry 14. Laser 11 generates light of frequency $\omega$, which is transmitted through gas cell 12. Gas cell 12 contains a gas having an absorption spectrum characterized by one or more peaks corresponding to atomic or molecular transitions. As the light from laser 11 transmits through cell 12, the light may interact with one or more transitions of the gas within cell 12. Specifically, if the frequency $\omega_L$ of the laser light is resonant, or near-resonant, with a transition at frequency $\omega_A$, then that transition (which appears as a peak in the absorption spectrum of the gas) will at least partially absorb the laser light. Such an absorption reduces the irradiance of light transmitted through cell 12. Thus, the closer the laser frequency $\omega_L$ is to the absorption peak $\omega_A$ of the gas, the lower the transmitted irradiance. The photodiode 13 measures the irradiance of the transmitted light and generates an output that is fed into controller circuitry 14. Based on the output of photodiode 13, controller circuitry 14 determines whether laser frequency $\omega_L$ is on-resonance with the transition (i.e., $\omega_L$ is at the peak $\omega_A$ of the absorption line for that transition), and if not, the circuitry sends an appropriate signal to laser 11 to cause the laser to bring $\omega_L$ closer to resonance. Photodiode 13 then measures the irradiance of the new frequency $\omega_L$ of laser light transmitted through cell 12, and the output is provided to circuitry 14, which may send further signals to laser 11 to bring $\omega_L$ still closer to resonance, if required. In other words, a feedback loop may be used to lock laser 11 to a peak in the absorption spectrum of the gas within cell 12.

Specifically, the frequency difference between the laser frequency $\omega_L$ and the frequency absorption peak $\omega_A$ may be modulated, which causes modulation in the irradiance measured by photodiode 13. The output of the photodiode 13 provides a dispersive-shaped error signal: positive voltage when $\omega_L > \omega_A$, negative voltage when $\omega_L < \omega_A$, and zero voltage when $\omega_L = \omega_A$. The error signal is employed in a feedback loop to lock the laser frequency to a particular value, typically the frequency where the error signal is zero: $\omega_L = \omega_A$. The shape of the error signal is proportional to the derivative of the absorption spectrum, so that any physical changes leading to a change in the absorption frequency $\omega_A$ will produce frequency shifts in the laser lock frequency $\omega_L$, as described in greater detail below.

As is familiar to those of ordinary skill in the art, circuitry 14 may include a lock-in amplifier that generates a sinusoidal signal, and a current controller that controls the driver current of laser 11. The lock-in amplifier provides the sinusoidal signal to the current controller, causing the current controller to sinusoidally vary the driver current of laser 11 about a central current selected to generate frequency $\omega_L$. This sinusoidal current variation causes the laser frequency to vary sinusoidally about frequency $\omega_L$, typically by a relatively small amount. The sinusoidal variation about frequency $\omega_L$ causes the irradiance of light transmitted through cell 12 to similarly vary sinusoidally, as the variation periodically brings the frequency closer or further from the absorption peak $\omega_A$. Photodiode 13 records the sinusoidal variations in the irradiance of transmitted light, and the photodiode output is provided to the lock-in amplifier. The lock-in amplifier carries on-board circuitry that locks to the sinusoidally varying output signal. The current controller may then vary the central current so as to bring the central frequency $\omega_L$ closer to the absorption peak $\omega_A$, which will be detected as a decreased signal at the photodiode 13. For further details, see the following references, the entire contents of each of which are incorporated by reference herein: Weel et al., Can. J. Phys. 80, 1449-1458 (2002); Furuta et al., Appl. Opt. 28(17), 3737-3743 (1989); Akiyama et al., U.S. Pat. No. 4,833,681; Telle, U.S. Pat. No. 5,553,087; and Tetu et al., IEEE Trans. Instrum. Meas. 40(2), 191-195 (1991).

In one example, the gas within cell 12 is hydrogen cyanide ($H^{13}C^{14}N$), the absorption spectrum of which has a series of several spaced peaks between about 1525-1565 nm that correspond to rotational-vibrational transitions. Laser 11 may be locked to any one of these peaks. In another example, the gas within cell 12 is rubidium-87 ($Rb^{87}$), which may be successfully employed with a significantly lower vapor pressure (e.g., $2\times10^{-6}$ torr) than hydrogen cyanide (e.g., about 10 torr), resulting in essentially collisionless conditions. As known to those of ordinary skill in the art, $Rb^{87}$ has four $D_1$ electronic transitions 20 illustrated in FIG. 2A, corresponding to peaks A, B, C, and D in the atomic absorption spectrum 21 of $Rb^{87}$ at 35° C., illustrated in FIG. 2B. Specifically, $Rb^{87}$ has four hyperfine electronic transitions: $5^2S_{1/2}$ ($F_g$=2) to $5^2P_{1/2}$ ($F_e$=1), corresponding to peak A; $5^2S_{1/2}$ ($F_g$=2) to $5^2S_{1/2}$ ($F_e$=2), corresponding to peak $\overline{B}$; $5^2S_{1/2}$ ($F_g$=1) to $5^2P_{1/2}$ ($F_e$=1), corresponding to peak C; and $5^2S_{1/2}$ ($F_g$=1) to $5^2P_{1/2}$ ($F_e$=2), corresponding to peak D. Note that although each of the transitions is characterized by a single frequency, the corresponding peak in the absorption spectrum is somewhat broadened because of Doppler broadening, leading to overlap between the peaks. The x-axis of FIG. 2B, "laser detuning," refers to the frequency by which laser 11 may be detuned from the "center of gravity" of the optical spectrum ($3.77 \times 10^{14}$ Hz) to match the absorption feature in the drawing.

As illustrated in FIG. 2B, the laser is typically locked to frequency 23, which corresponds to the $5^2S_{1/2}$ ($F_g$=1) to $5^2P_{1/2}$ ($F_e$=2) electronic transition (the maximum of peak D). This frequency is typically selected because of the four illustrated absorption peaks A-D, peak D overlaps the least with an adjacent peak (peak C). However, as is familiar to those of ordinary skill in the art, the presence of overlapping peaks in the absorption spectrum "pulls" the laser frequency ω away from the true center of the desired peak. The breadth of each of peaks A-D may vary as a function of the gas temperature, due to Doppler broadening, and the relative amplitude of the peaks may also vary as a function of the gas temperature, because of the nonlinear nature of resonant absorption, e.g., because of Beer-Lambert exponential attenuation. As the breadths and/or heights of the different peaks change, the amount of overlap—and thus the amount of pulling—may also increase or decrease with temperature, and as a consequence the peaks of the absorption lines may shift with the vapor's temperature. Note that according to the Beer-Lambert law, the transmitted irradiance I is equal to $I_o e^{-N\sigma L}$, where N is the number density of atoms or molecules in the gas, σ is the absorption cross-section, and L is the gas length. The shape of the absorption spectrum (e.g., I versus the laser frequency ω) will mimic the shape of the absorption cross section σ for optically thin gases, where $N\sigma L \ll 1$. For optimized laser stabilization systems, where $N\sigma L \sim 1$, the detailed shape of the absorption spectrum may deviate from the absorption cross section σ, and will depend on N. Specifically, the absorption spectrum will have a width that increases with N.

One way of reducing the change in the locking frequency is sub-Doppler spectroscopy. In such a technique, the apparent Doppler broadening is reduced by irradiating gas cell 12 with overlapping, counter-propagating laser beams. Each of the counter-propagating beams experiences an opposite Doppler shift as the other, canceling out the Doppler broadening effect. For further details, see Schawlow, Rev. Mod. Phys. 54(3), 697-707 (1982), the entire contents of which are incorporated by reference herein. However, sub-Doppler spectroscopy may not be available to eliminate all sources of pulling. For example, it may be preferable to use linear absorption spectroscopy, instead of sub-Doppler spectroscopy, for UAP. Specifically, linear spectroscopy allows for simplicity (and thereby compactness) of design. Further, without the need of overlapped, counter-propagating beams these is less sensitivity to microphonics. Additionally, although sub-Doppler spectroscopy may reduce pulling due to Doppler broadening, it is ineffective to reduce pulling resulting from other types of broadening, such as pressure broadening.

SUMMARY

Embodiments of the invention provide systems and methods for stabilizing laser frequency based on an isoclinic point in the absorption spectrum of a gas. An isoclinic point is defined to be "[a] wavelength, wavenumber, or frequency at which the first derivative of an absorption spectrum of a sample does not change upon a chemical reaction or physical change of the sample." For many of the systems and methods disclosed herein, the isoclinic point is a point in the absorption spectrum of a gas that falls in between two overlapping absorption peaks of substantially equal amplitude, and which experience substantially the same broadening as a function of a physical parameter, e.g., as a function of temperature or pressure. Because the two peaks have substantially equal amplitude as one another, the isoclinic point is a saddle point (local minimum) in the region of overlap between the two peaks. As the peaks are evenly broadened due to a change in the physical parameter, the frequency of the isoclinic point does not significantly change, but instead remains at substantially constant frequency, independent of the physical parameter. As such, by locking the laser to the frequency of the isoclinic point, the laser is significantly less susceptible to frequency variations than if the laser were locked to an absorption peak, as was done in the prior art.

Under one aspect, a system for stabilizing the frequency of a tunable-frequency laser includes: a transmission cell containing a gas and configured to transmit light from the laser, the gas having an absorption spectrum with an isoclinic point; a photodiode configured to generate an output based on an irradiance of laser light transmitted through the cell; and circuitry configured to tune the frequency of the laser to the isoclinic point of the absorption spectrum based on the output.

In some embodiments, the absorption spectrum has first and second peaks respectively corresponding to first and second transitions of the gas, the first and second peaks overlapping with one another, the isoclinic point being a saddle point between the first and second peaks. The first and second peaks may have substantially equal amplitude as one another. The first and second peaks may broaden substantially equally with each other as a function of a physical parameter of the gas. The physical parameter may include temperature or pressure. The gas may include an atomic gas and the first and second transitions may be electronic transitions of atoms in the gas. The atomic gas may, for example, include an alkali selected from the group consisting of $Rb^{87}$, $Li^7$, $Na^{23}$, $K^{39}$, and $K^{41}$. In one embodiment, a fractional frequency of the isoclinic point varies by about $1.0 \times 10^{-12}$ or less per degree Celsius.

In some embodiments, the circuitry includes a lock-in amplifier configured to receive the output of the photodiode and to generate an error signal based on the output; and a controller in operable communication with the laser and the lock-in amplifier, the controller configured to tune the frequency of the laser so as to minimize the error signal. The controller may tune the frequency of the laser by adjusting a driver current of the laser.

Under another aspect, a method of stabilizing the frequency of a tunable-frequency laser may include transmitting light from the laser through a cell containing a gas, the gas having an absorption spectrum with an isoclinic point; measuring an irradiance of the laser light transmitted through the cell; and based on the measured irradiance, tuning the frequency of the laser to the isoclinic point of the absorption spectrum.

DETAILED DESCRIPTION

Overview

Embodiments of the present invention provide systems and methods for stabilizing laser frequency based on an isoclinic point in the absorption spectrum of a gas. As noted above, prior art systems for stabilizing laser frequency have typically been based on locking the laser frequency to an absorption peak of a gas. However, such a peak may be susceptible to pulling caused by lineshape overlap due to Doppler broadening, which can vary the frequency of the peak—and the laser—as a function of temperature. By comparison, the present inventors have recognized that the absorption spectra of some gases contain isoclinic points to which the laser can be locked, and that do not substantially change in frequency as a function of physical system parameters, such as temperature or pressure. As used herein, an isoclinic point is defined as "[a] wavelength, wavenumber, or frequency at which the first derivative of an absorption spectrum of a sample does not change upon a chemical reaction or physical change of the sample." Such a definition is the same as that defined by the International Union of Pure and Applied Chemistry (IUPAC), see *Compendium of Chemical Terminology*, $2^{nd}$ ed. (the "Gold Book"), Oxford (1997).

As described below, the inventors have discovered that isoclinic points exist for alkali atoms with nuclear spin I equal to 3/2, and that the frequencies of these isoclinic points are effectively independent of gas temperature. That is, the derivative $d\, v_o/dT$ at the isoclinic point is spectroscopically insignificant, where $v_o$ is the frequency at the isoclinic point and T is the gas temperature. The sensitivity of the alkali's isoclinic points to laser linewidth and optical pumping efficiency are also discussed further below. The practical conclusion is that isoclinic points in the spectra of alkali atoms may be useful reference frequencies for precision spectroscopy or laser-frequency stabilization, effectively eliminating slow temperature variations as a source of spectroscopic signal instability in UAP or other applications in which it is desirable to lock a laser to a frequency. It should be appreciated that although the discussion below is primarily directed to gases containing alkali atoms, that other types of atoms or molecules, including those in non-gas states, may also have absorption spectra with isoclinic points to which a laser can be locked. As such, the present invention applies to any system having an isoclinic point.

Figure 3:
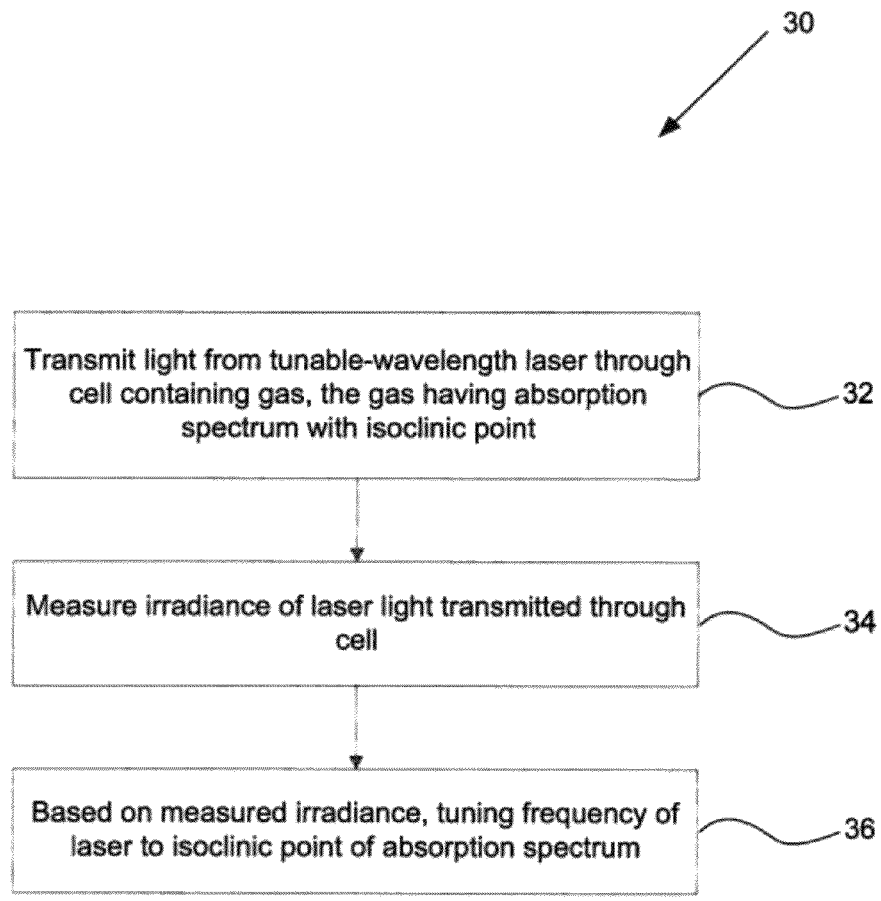
FIG. 3 is a flow chart of steps in a method of stabilizing a laser frequency based on an isoclinic point in an absorption spectrum of a gas, according to some embodiments of the present invention.

FIG. 3 is a flow chart of steps in an illustrative method 30 of stabilizing the frequency of a tunable-frequency laser, according to some embodiments of the present invention. First, light of frequency ω from the laser is transmitted through a cell containing an atomic gas, the gas having an absorption spectrum with an isoclinic point (32). For example, the absorption spectrum may include first and second peaks that respectively correspond to first and second transitions of the gas, and that may overlap with one another. The isoclinic point may be a saddle point between the first and second peaks, e.g., positioned midway between the two peaks, at a local minimum in the absorption spectrum. The first and second peaks may have substantially equal amplitude as one another, and may broaden substantially equally as one another as a function of a physical parameter of the gas (e.g., temperature or pressure). In one illustrative example, the gas includes an alkali atomic gas having a nuclear spin of 3/2, e.g., $Rb^{87}$, $Li^7$, $Na^{23}$, $K^{39}$, or $K^{41}$. In such examples, the first and second peaks may correspond to the $5^2S_{1/2}$ ($F_g=2$) to $5^2P_{1/2}$ ($F_e=1$) and the $5^2S_{1/2}$ ($F_g=2$) to $5^2P_{1/2}$ ($F_e=2$) electronic transitions of the gas However, it should be understood that any material (including gases, solids, liquids, and plasmas) having an isoclinic point may be used.

Figure 4:
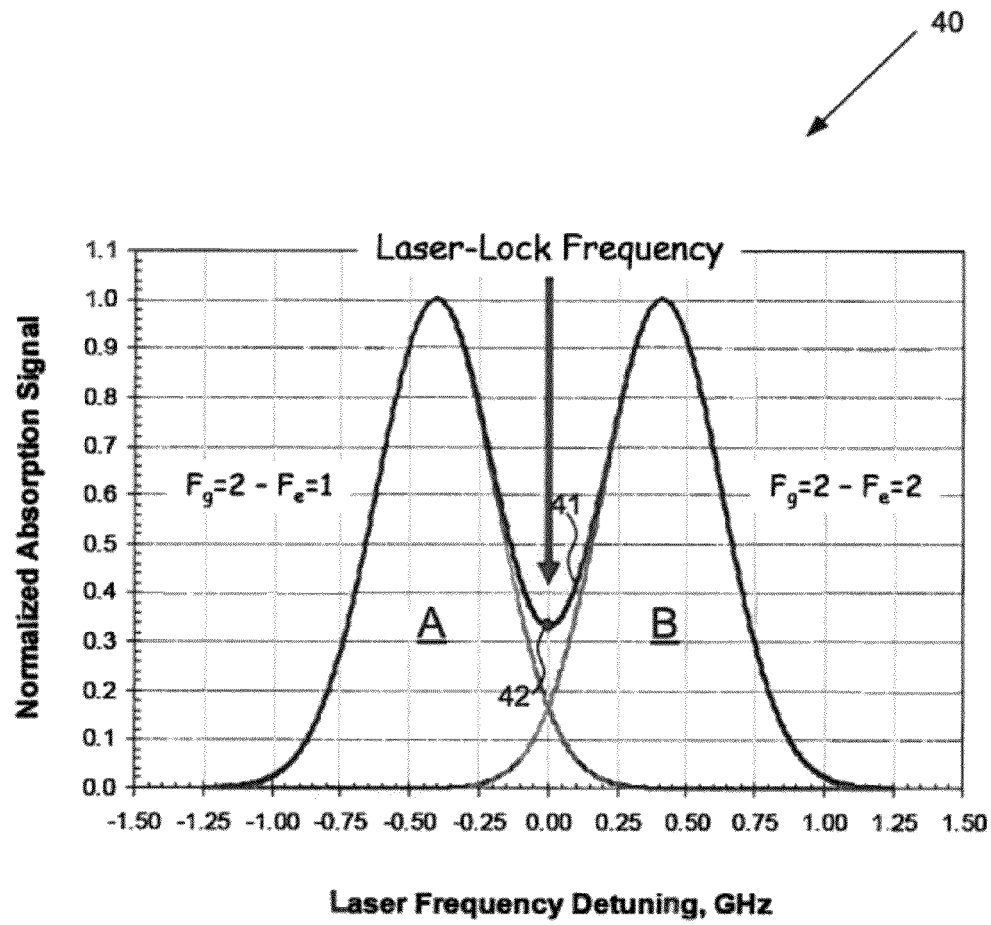
FIG. 4 is a plot of the calculated atomic absorption spectrum of $Rb^{87}$, as a function of laser detuning frequency, near an isoclinic point, according to some embodiments of the present invention.

In one embodiment, the gas is $Rb^{87}$. FIG. 4 is a plot of the calculated absorption spectrum of $Rb^{87}$ in the region of absorption peaks A and B at a temperature of 35° C. Similar to FIG. 2B described above, the frequency of the center of gravity of FIG. 4 is set to zero. As described in greater detail below, peaks A and B of Rb$^{87}$ correspond to $5^2S_{1/2}$ ($F_g$=2) to $5^2P_{1/2}$ ($F_e$=1) and the $5^2S_{1/2}$ ($F_g$=2) to $5^2P_{1/2}$ ($F_e$=2) transitions, overlap with one another due to Doppler broadening, have equal amplitude as one another, and broaden substantially equally as one another as a function of temperature, again due to Doppler broadening. As such, the sum 41 of the two peaks has an isoclinic point 42 that is positioned equidistant between peaks A and B, and is a local minimum between the peaks. If the temperature of the gas fluctuates, then the breadth of peaks A and B may vary because of Doppler broadening. However, the lateral (frequency) position of isoclinic point 42 will remain substantially the same because the lateral frequency shift from each of the two peaks will cancel each other out. Instead, only a vertical shift in the position of isoclinic point 42 will occur. As the frequency of isoclinic point 42 is substantially insensitive to temperature, it can be used as a laser lock frequency to provide significantly greater stability than other points in the absorption spectrum. For example, as described above with respect to FIG. 2B, if the maximum peak D were instead selected for the laser lock frequency, then if the temperature of the gas fluctuates, causing a change in the breadth and/or amplitude of peaks C and D, then the varying amount of overlap between peaks C and D would pull the laser lock frequency away from that maximum, causing instability in the laser lock frequency.

Figure 2A:
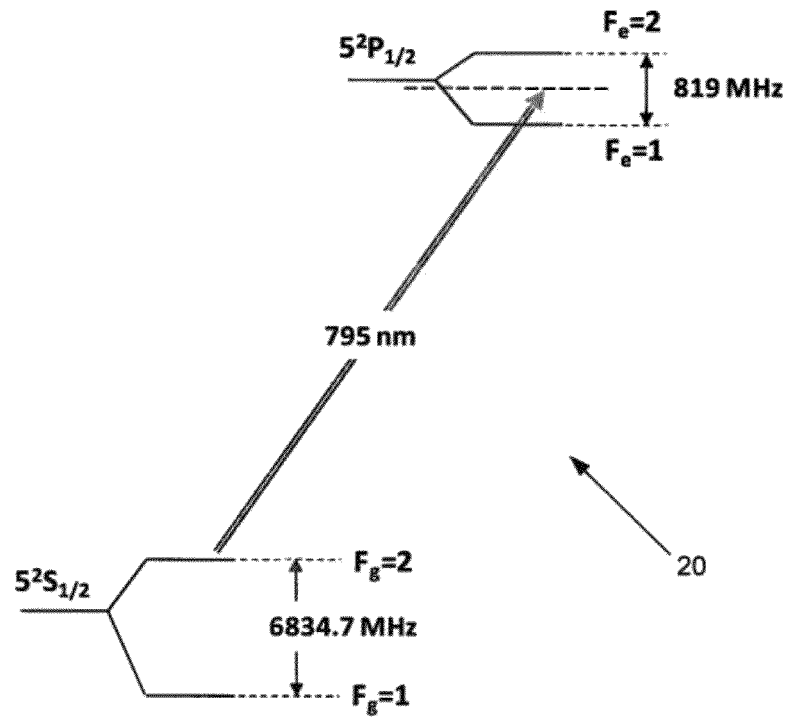
FIG. 2A schematically illustrates the electronic transitions of $Rb^{87}$.
Figure 2B:
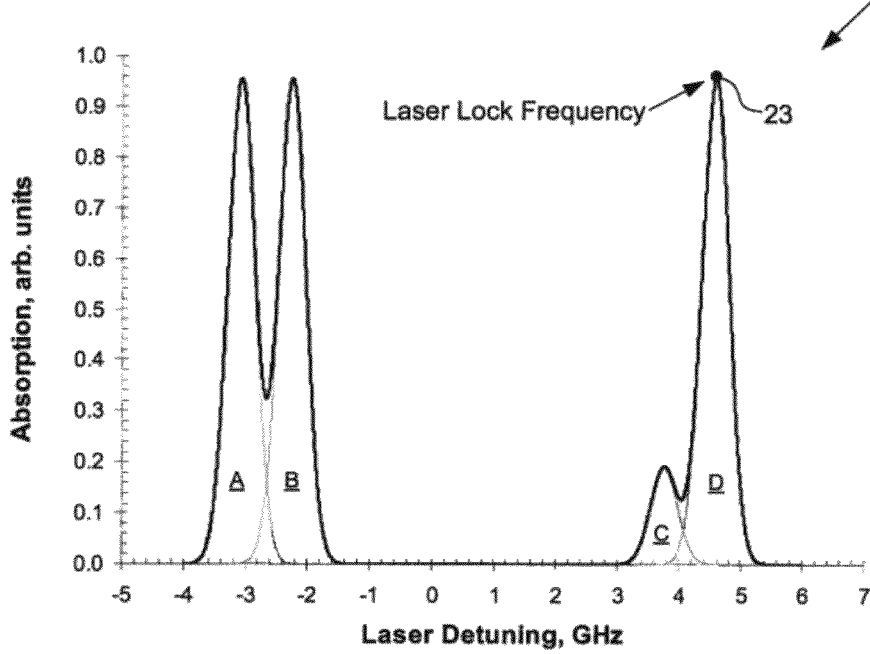
FIG. 2B is a plot of the calculated atomic absorption spectrum of $Rb^{87}$ as a function of laser detuning frequency.
Figure 5:
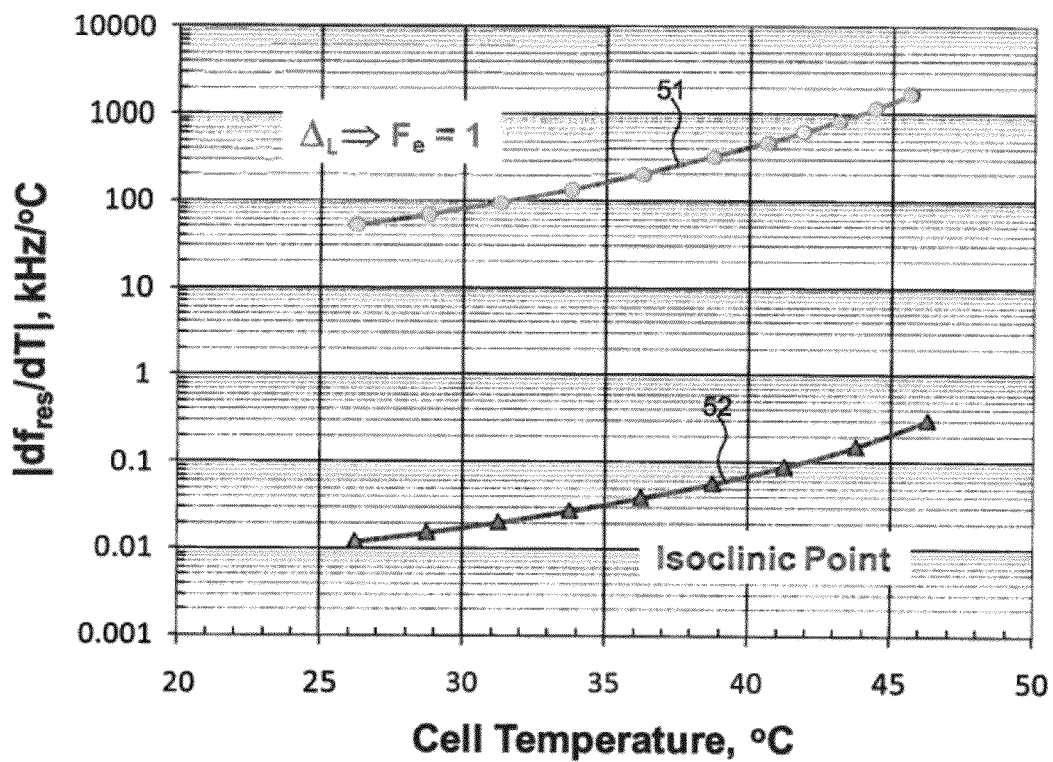
FIG. 5 is a plot of the calculated change in frequency as a function of temperature for peak D in the absorption spectrum of FIG. 2B and for the isoclinic point in the absorption spectrum of FIG. 4, according to some embodiments of the present invention.

FIG. 5 is a plot of the temperature sensitivity 51 of the maximum of peak D illustrated in FIG. 2B, and the temperature sensitivity 52 of isoclinic point 42 illustrated in FIG. 4. As can be seen, the change in frequency with temperature of the maximum of peak D is several orders of magnitude higher than that of isoclinic point 42. As discussed in greater detail below, the presence of residual Rb$^{85}$ (here, 1% Rb$^{85}$) may cause a small amount of pulling away from isoclinic point 42, leading to some variation in frequency as a function of temperature. However, even with such variation, the selection of the isoclinic point for the laser lock frequency offers a substantial improvement in performance over the selection of an absorption peak maximum, such as that of peak D illustrated in FIG. 2B.

Figure 1:
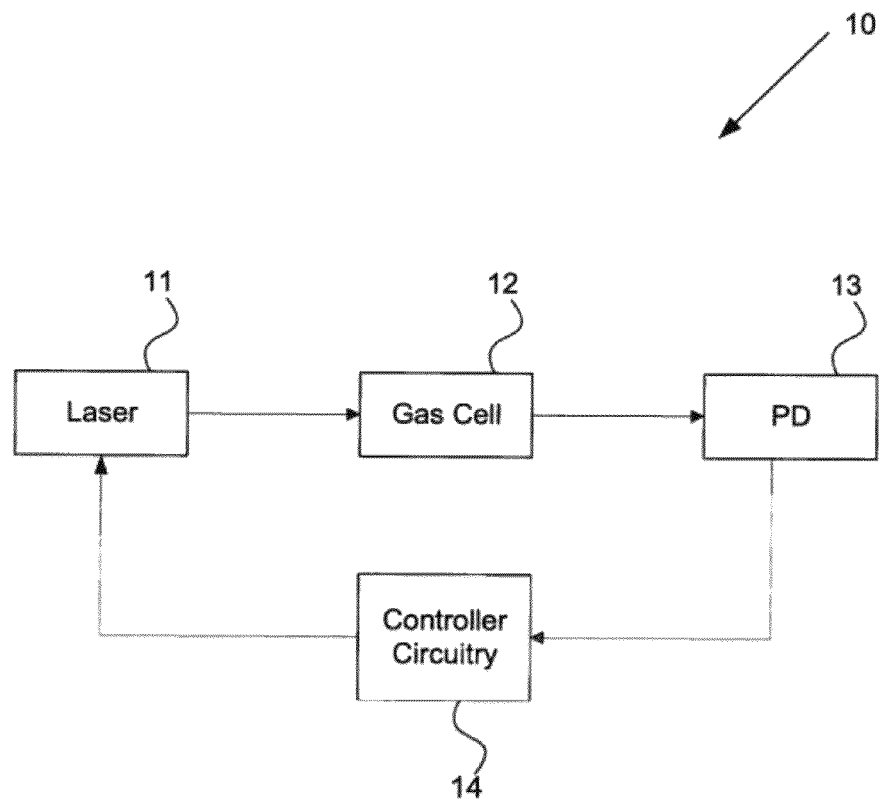
FIG. 1 schematically illustrates a prior art system for locking a laser to an atomic absorption line.

The laser 11 and cell 12 may be arranged substantially as illustrated in FIG. 1. The laser may be any suitable laser, including a continuous-wave (CW) or pulsed laser, the frequency of which is tunable via any suitable mechanism. For example, the laser may be a diode laser, the frequency of which is tunable by adjusting the temperature of the diodes and/or by adjusting the driver current applied to the diodes. A control module for making such adjustments may be internal to the laser, or may be external. In some embodiments, the frequency of the laser is tuned by adjusting the driver current applied to the diodes, using a suitable controller. Preferably, the laser is tunable through a variety of frequencies that correspond to one or more features of the absorption spectrum of the gas, including the isoclinic point. It should be noted that because different gases may have isoclinic points in widely different regions of the spectrum, the type of laser 11 and the type of gas used in cell 12 may be co-selected to respectively provide an output in the desired frequency range and an isoclinic point to which the laser frequency may be locked. In one embodiment, laser 11 is a vertical cavity surface-emitting laser (VCSEL), the frequency of which may be controllably selected by appropriately adjusting the temperature and/or driver current of the laser.

Referring again to FIG. 3, the irradiance of laser light transmitted through the cell is then measured (34). As described above with reference to FIG. 1, the transmitted irradiance depends, among other things, on the extent to which the laser light is absorbed by transitions of the gas. The transmitted irradiance can be measured, for example, using a suitable photodiode, such as photodiode (PD) 13 in FIG. 1.

Then, based on the measured irradiance, the frequency of the laser may be tuned to the isoclinic point in the absorption spectrum of the gas (36). The general mechanism for such tuning may, for example, be similar to that described above with reference to FIG. 1, e.g., the frequency may be tuned using a feedback look that includes a lock-in amplifier and a current controller. However, it should be understood that while prior art systems have been directed to tuning the laser to the maximum of an absorption peak, the systems and methods provided herein instead tune the laser to a seemingly counterintuitive position in the absorption spectrum—a local minimum, positioned between two equal-amplitude absorption peaks. As described in greater detail below, such a position is significantly less vulnerable to frequency changes as a function of physical parameters, such as temperature or pressure, than is the maximum of a peak.

A brief theoretical overview of the use of isoclinic points to address the problem of Doppler broadening will now be provided. Then, the specific case of isoclinic points in the alkali atoms, in particular Rb$^{87}$, is provided, including a consideration of the isoclinic point's sensitivity to the Rb$^{85}$/Rb$^{87}$ isotope ratio and laser linewidth. Finally, an experimental investigation of the Rb$^{87}$ D$_1$ transition is discussed, and the effects of optical pumping on the D$_1$ isoclinic point described.

Isoclinic Points to Address Doppler Broadening

As noted above with respect to FIGS. 2A-2B, peaks corresponding to electronic transitions may be Doppler broadened, leading to overlap that may cause a laser frequency to be pulled away from a desired frequency. To illustrate the problem more quantitatively, consider two neighboring Doppler-broadened transitions, A and B, such as those illustrated in FIG. 2B, where $w_D$ is the Doppler-broadened full-width half-maximum (FWHM) of either peak A or B. For a laser of frequency $\omega_L$ tuned near these absorption lines, the irradiance I transmitted by a gas of length L can be expressed as:

$$I(L)=I_o\exp[-NL[\sigma_A(\Delta_A)+\sigma_B(\Delta_B)]], \quad (1)$$

where $\sigma_J(\Delta_J)$ is the cross section of the J$^{th}$ resonance and $\Delta_J$ is the detuning from the true resonant frequency of the transition: $\Delta_J=\omega_L-\omega_J$. Taking the derivative of Eq. (1) with respect to laser frequency $\omega_L$ and setting this equal to zero, we find the extrema in the absorption spectrum:

$$\frac{dI(L)}{d\omega_L} = -NLe^{-N[\sigma_A(\Delta_A)+\sigma_B(\Delta_B)]L}\left(\frac{d\sigma_A}{d\omega_L}+\frac{d\sigma_B}{d\omega_L}\right) \quad (2)$$

$$= 0 \Rightarrow \left(\frac{d\sigma_A}{d\omega_L}+\frac{d\sigma_B}{d\omega_L}\right)$$

$$= 0.$$

For the case of the extremum near absorption line A, this yields the peak frequency of the A transition:

$$\omega_{pA} = \omega_A - \Delta_B\left(\frac{\sigma_{pB}}{\sigma_{pA}}\right)e^{-4ln(2)(\Delta_B/w_D)^2} \quad (3)$$

$$\cong \omega_A - (\omega_A-\omega_B)\left(\frac{\sigma_{pB}}{\sigma_{pA}}\right)e^{-4ln(2)((\omega_A-\omega_B)/w_D)^2},$$

where $\sigma_{pJ}$ is the peak absorption cross section of the J$^{th}$ transition, and where $\omega_{pA}$ is seen to have a temperature dependent shift due to the temperature sensitivity of the Doppler width. To be clear, $\omega_{pA}$ is the peak frequency of the absorption line A, while $\omega_A$ is the intrinsic resonant frequency of the transition, e.g., the $5^2S_{1/2}$ ($F_g$=2) to $5^2P_{1/2}$ ($F_e$=1) transition for Rb$^{87}$. In particular, for small changes about some reference temperature $T_o$, and defining $\Delta_{AB}$ as $\omega_A - \omega_B$, the peak frequency of the transition will vary as $$\frac{\delta \omega_{pA}}{\delta T} = -4\ln(2) \frac{\Delta_{AB}}{T_o} \left( \frac{\sigma_B(\Delta_{AB})}{\sigma_{pA}} \right) \left( \frac{\Delta_{AB}}{w_D(T_o)} \right)^2. \tag{4}$$

For absorption line A in FIG. 2B near room temperature this yields $\delta \omega_{pA}/\delta T \cong 16$ kHz/° C. or in fractional frequency, y, $4.2 \times 10^{-11}$/° C. (i.e., $y \cong \delta \omega/\omega_o$). This is a relatively large temperature sensitivity, and demonstrates the significance of temperature variations for precision vapor-phase spectroscopy.

Without wishing to be bound by any theory, the inventors believe that the temperature dependence indicated by Eq. (4) may arise from the fact that, near an absorption line's peak, one of the cross-section derivatives becomes effectively independent of temperature while the other retains its Doppler-broadening temperature sensitivity. Conversely, near the midpoint between the two resonances, both derivatives are temperature dependent. In particular, if $\omega_m$ is defined to be the frequency corresponding to the local extremum near the midpoint, then for reasonably well-resolved, Doppler-broadened absorption lines, $$\omega_m \cong \left( \frac{\omega_A + \omega_B}{2} \right) - \frac{(\sigma_{pA} - \sigma_{pB})}{(\sigma_{pA} + \sigma_{pB})} \frac{\Delta_{AB} w_D^2}{4\ln(2)\Delta_{AB}^2 - 2w_D^2}. \tag{5}$$

In this case, the temperature dependence of the extremum only arises when the absorption cross-sections of the two transitions are unequal. When $\sigma_{pA}$ equals $\sigma_{pB}$, the second term on the right-hand-side of Eq. (5) is identically zero, and the frequency of the local extremum equals the intrinsic midpoint frequency of the two transitions independent of temperature: it is an isoclinic point.

Figure 6:
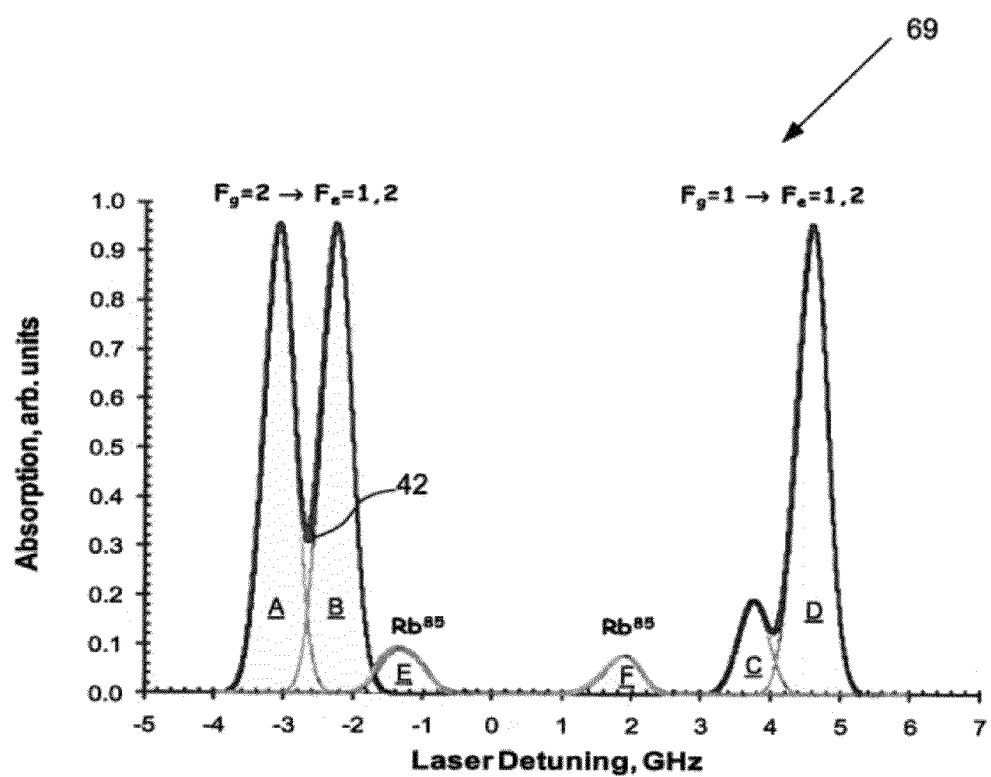
FIG. 6 is a plot of the calculated atomic absorption spectrum of a mixture of $Rb^{87}$ and $Rb^{85}$ as a function of laser detuning frequency.

Notwithstanding the above discussion, for precision spectroscopy it is important to note that isoclinic points are idealizations. Without wishing to be bound by any theory, it is believed that no gas-phase atomic or molecular spectral feature will ever be insensitive to a "physical change of the sample" to all orders. For example, in real systems, alkali isotopes often co-exist, and even in a vapor of "pure" Rb$^{87}$ there is always some fractional component of Rb$^{85}$ (e.g., 10% residual Rb$^{85}$) with absorption lines E, F that overlap (albeit slightly) those of Rb$^{87}$, as illustrated in FIG. 6. This overlap implies that Eq. (1) may be augmented with a third absorption cross-section, complicating the simple argument leading to Eq. (5). Moreover, because single mode lasers may be dominated by white frequency fluctuations, producing lorentzian laser spectra with corresponding long tails, there also may be an interaction between Rb$^{85}$ contamination and laser linewidth. Finally, an alignment among the ground-state Zeeman sublevels produced by optical pumping may degrade the equality between the A and B cross-sections, thereby giving the isoclinic point an alternate path to temperature sensitivity. As noted above with respect to FIG. 5, the presence of residual Rb$^{85}$ may cause the frequency of the isoclinic point to vary with temperature; however the extent of such variation is expected to be significantly smaller than that for the maximum of an absorption peak. Issues associated with residual Rb$^{85}$ are described in further detail below with reference to FIGS. 6 and 7A-7B.

Isoclinic Points for Alkali Gases

As may be derived from prior art atomic physics theory, the peak cross section for a $D_1$ transition in the alkalies (i.e., excited and ground state electronic angular momenta, $J_e$ and $J_g$, respectively, equal to ½) originating from the $F_g$=I+½ ground-state hyperfine manifold (where I is the nucleus's spin angular momentum quantum number) may be expressed as $$\sigma_p(F_g, F_e) = \sigma_o[J_g]\left(1 + \frac{2\langle \vec{I} \cdot \vec{S} \rangle}{(I+1)}\right) \begin{cases} \frac{(2I+3)(I+1)}{6(2I+1)^2}; & F_e = I + \frac{1}{2} \\ \frac{2I(I+1)}{3(2I+1)^2}; & F_e = I - \frac{1}{2}, \end{cases} \tag{6}$$

where $\langle \vec{I} \cdot \vec{S} \rangle$ is a measure of ground-state hyperfine polarization (e.g., the population imbalance between the two ground-state hyperfine levels) and $\sigma_o$ is the integrated $D_1$ absorption cross section (the expressions herein use the notation $[J] \cong (2J+1)$.) Employing the second approximation of Whiting, J. Quant. Spectrosc. Radiat. Transfer 8, 1379-1384 (1968), the entire contents of which are incorporated by reference herein, for a Voigt profile, the functional relationship between $\sigma_o$ and the transition's oscillator strength, f, can be obtained:

$$\sigma_o = \frac{2\pi^2 r_o fc}{w_V \left[1.065 + 0.447\left(\frac{w_L}{w_V}\right) + 0.058\left(\frac{w_L}{w_V}\right)^2\right]}, \tag{7}$$

where $r_o$ is the classical electron radius. The values $w_L$, $w_D$, and $w_V$ correspond to the FWHM of the Lorentzian, Doppler, and Voigt profiles, respectively, and are related by:

$$w_V = \frac{w_L}{2} + \sqrt{\frac{w_L^2}{4} + w_D^2}. \tag{8}$$

Similarly, for the $D_1$ transition originating from the $F_g$=I−½ hyperfine manifold, $$\sigma_p(F_g, F_e) = \sigma_o[J_g]\left(1 - \frac{2\langle \vec{I} \cdot \vec{S} \rangle}{I}\right) \begin{cases} \frac{2I(I+1)}{3(2I+1)^2}; & F_e = I + \frac{1}{2} \\ \frac{I(2I-1)}{6(2I+1)^2}; & F_e = I - \frac{1}{2}. \end{cases} \tag{9}$$

Writing Whiting's second approximation for the Voigt profile in detail, the frequency dependence of the absorption cross-sections may be expressed as $$\sigma_{F_g, F_e}(\Delta_J) = \sigma_p(F_g, F_e) \tag{10}$$

$$\left\{ \begin{array}{l} \left[1 - \frac{w_L}{w_V}\right] e^{-4\ln(2)(\Delta_J/w_V)^2} + \left[\frac{w_L}{w_V}\right]\left[\frac{1}{1+4(\Delta_J/w_V)^2}\right] + \\ \frac{1}{62.5}\left[1 - \frac{w_L}{w_V}\right]\left[\frac{w_L}{w_V}\right]\left\{e^{-0.4(|\Delta_J|/w_V)^{9/4}} - \frac{10}{10 + (|\Delta_J|/w_V)^{9/4}}\right\} \end{array} \right\},$$

where the index J corresponds to one of the $F_g \rightarrow F_e$ resonances illustrated in FIGS. 2A-2B.

Note that the two cross sections originating from the $F_g$=I+½ ground-state hyperfine manifold (expressed by Eq. (6)) will be equal when I=3/2, corresponding to the stable alkali isotopes Li$^7$, Na$^{23}$, K$^{39}$, K$^{41}$, and Rb$^{87}$. Thus, there will be an isoclinic point midway between these transitions. Table I lists the D$_1$ transition properties of various alkali isotopes that it is believed would show an isoclinic point at an extremum of the n$^2$S$_{1/2}$ (F$_g$=2)→n$^2$P$_{1/2}$ (F$_e$=1,2) transitions. The temperatures were chosen to produce a vapor density of 10$^{10}$ cm$^{-3}$, and $\Delta v_{hfs}$ corresponds to the hyperfine splitting in the n$^2$P$_{1/2}$ (first resonance) state. Note that only in the case of Rb$^{87}$ will the two D$_1$ transitions be resolved relative to the Doppler width, which is given in the last column. Of these isotopes, as shown in Table I, Rb$^{87}$ produces the largest vapor densities at the lowest temperatures, which may be particularly useful for UAP applications. Conversely, the two peak cross sections originating from the F$_g$=I–½ ground-state hyperfine manifold (expressed by Eq. (9)) are only equal for the unphysical case of I=–5/2. Thus, for the D$_1$ transition of the alkalies, excitation from F$_g$=I–½ will not yield an isoclinic point at an extremum of the absorption cross section.

TABLE I

| Alkali | Abundance | 1$^{st}$ Resonance λ D$_1$, nm | $\Delta v_{hfs}$, MHz | T, ° C. | $\Delta v_D$, MHz |
|---|---|---|---|---|---|
| Li$^7$ | 93% | 670.8 | 92 | 291 | 2872 |
| Na$^{23}$ | 100% | 589.6 | 189 | 114 | 1494 |
| K$^{39}$ | 93% | 769.9 | 58 | 53 | 806 |
| K$^{41}$ | 7% | 769.9 | — | 53 | 786 |
| Rb$^{87}$ | 28% | 794.8 | 812 | 25 | 500 |

Note that because of the relatively low natural abundance of Rb$^{87}$, it may be impracticable to completely isolate that isotope relative to Rb$^{85}$. As such, as illustrated in FIG. 6, the absorption spectrum 69 of Rb$^{87}$ gas may contain a small amount of Rb$^{85}$, which exhibits absorption peaks E and F. Because the Rb$^{85}$ peak E overlaps slightly with Rb$^{87}$ peak B, variations in the amplitude or breadth of peak E as a function of temperature may cause the laser lock frequency to pull away from isoclinic point 42 as temperature varies. Using the above equations, the frequency of the local extremum midway between the 5$^2$S$_{1/2}$ (F$_g$=2)→5$^2$P$_{1/2}$ (F$_e$=1,2) absorption lines of Rb$^{87}$ (A and B in FIG. 4), i.e., the isoclinic point, may be calculated as a function of the relative Rb$^{85}$ concentration. Briefly, the cross section for each transition may be computed at a given laser frequency, including the Rb$^{85}$ contribution, the cross-sections summed to evaluate the Beer's law attenuation of the laser, and finally the frequency determined near the midpoint where the derivative of the transmitted laser intensity is zero, i.e., near the isoclinic point. The extent to which the frequency of this local extremum is insensitive to vapor temperature is a measure of how well the extremum approximates an ideal isoclinic point. As used herein, the term "isoclinic point" may refer both to an ideal isoclinic point, and to a non-ideal isoclinic point of a real gas, such as Rb$^{87}$.

Figure 7A:
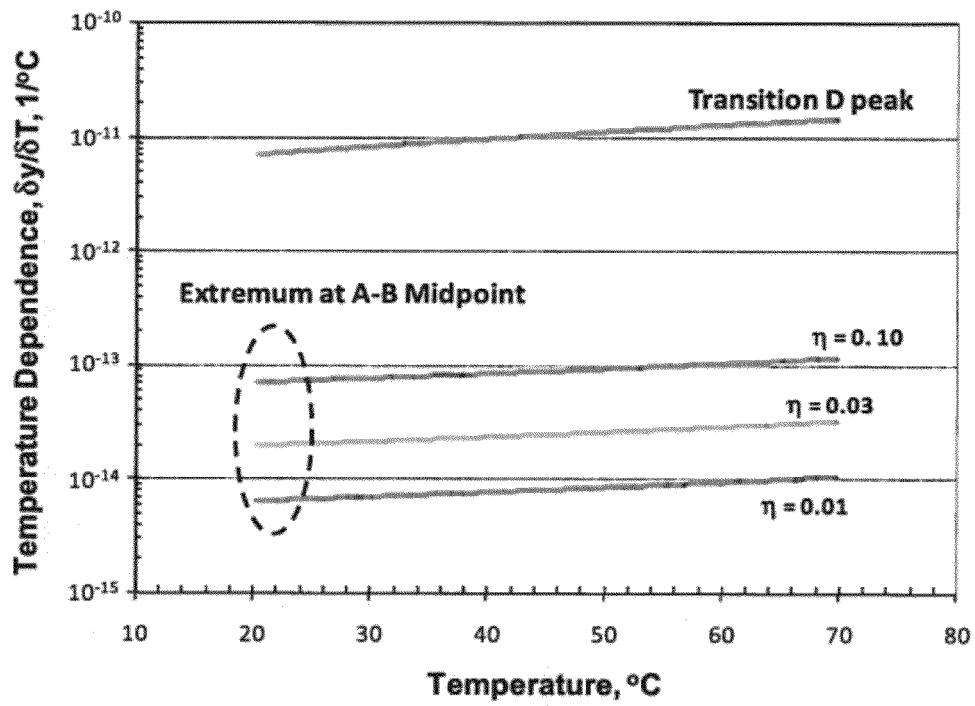
FIG. 7A is a plot of the calculated change in the fractional frequency as a function of temperature for the extremum near the isoclinic point in the absorption spectrum of FIG. 6 for different values of the fractional abundance of $Rb^{85}$ as compared to $Rb^{87}$, according to some embodiments of the present invention.

Defining η as the fractional abundance of Rb$^{85}$ in the vapor: η≅N(Rb$^{85}$)/[N(Rb$^{85}$)+N(Rb$^{87}$)], the fractional-frequency change of the extremum (isoclinic point) is illustrated in FIG. 7A as a function of vapor temperature for η=0.01, 0.03, and 0.1. For comparative purposes, the fractional-frequency change of the local extremum corresponding to the peak of the 5$^2$S$_{1/2}$ (F$_g$=1)→5$^2$P$_{1/2}$(F$_e$=2) absorption line (i.e., the maximum of peak D in FIG. 2B) is also illustrated. Of all the transitions in the Rb$^{87}$ D$_1$ spectrum, peak D is the most well-isolated, having a relatively small overlap with peak C. Note that, as illustrated in FIG. 7A, even for a Rb$^{85}$ abundance of 10%, the temperature sensitivity of the local extremum near the midpoint of the A-B transitions is two orders of magnitude smaller than that of the peak frequency associated with transition D. Consequently, isotope ratio would appear to have little effect on the isoclinic nature of the midpoint extremum.

Figure 7B:
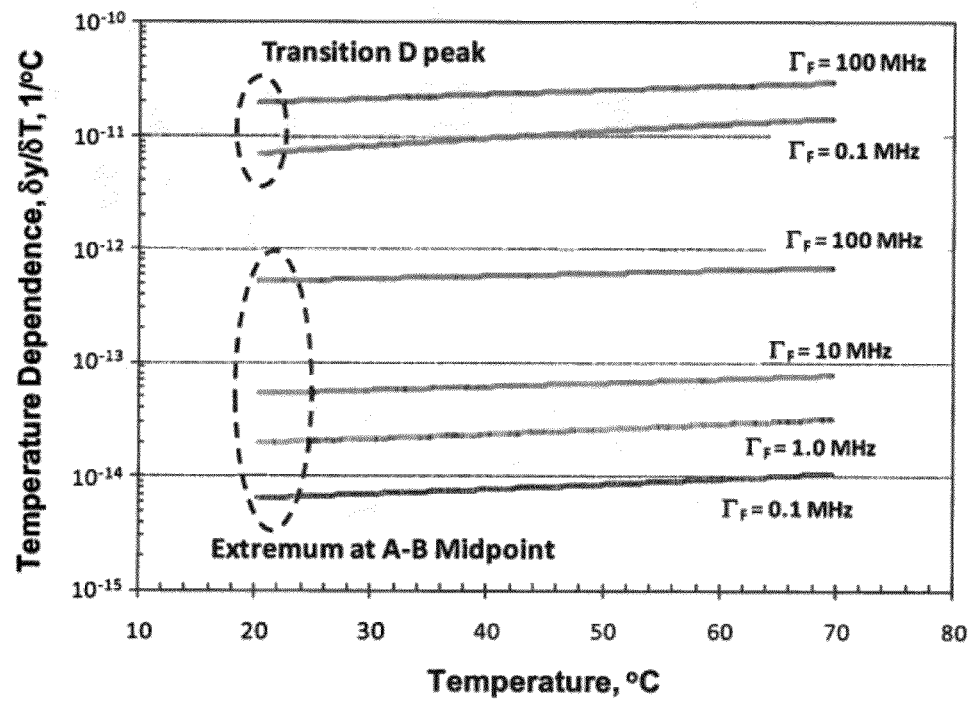
FIG. 7B is a plot of the calculated change in the fractional frequency as a function of temperature for the extremum near the isoclinic point in the absorption spectrum of FIG. 6 for different values of the laser linewidth, according to some embodiments of the present invention.

FIG. 7B shows the influence of laser linewidth on the change in fractional frequency y as a function of temperature T, δy/δT for the A-B midpoint extremum (isoclinic point). Note that even for linewidths of 100 MHz, such as may be achieved with vertical cavity surface-emitting lasers (VCSELs) at moderate injection currents above threshold, the A-B midpoint extremum acts very much like an ideal isoclinic point because δy/δT<10$^{-12}$/° C. Moreover, δy/δT for this extremum is significantly less than the temperature sensitivity of the D-transition's peak frequency for all reasonable laser linewidths.

Experiment

Figure 8:
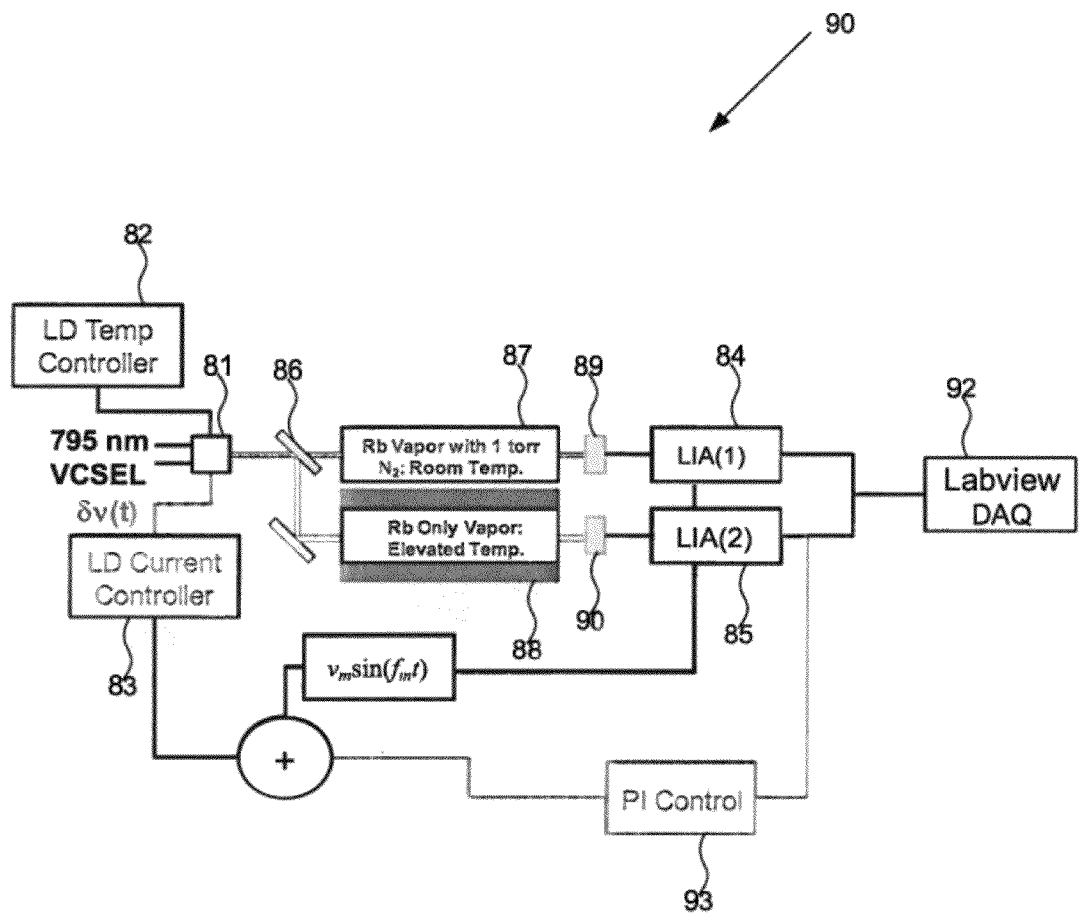
FIG. 8 schematically illustrates an experimental setup used to measure the change in frequency as a function of temperature for the 4.6 GHz peak in the absorption spectrum of FIG. 2B and for the isoclinic point in the absorption spectrum of FIG. 6, according to some embodiments of the present invention.

FIG. 8 schematically illustrates an experimental system 80 used to measure the temperature dependence of the frequencies of the isoclinic point 42 and the maximum of peak D for a gas containing approximately 99% Rb$^{87}$ and 1% Rb$^{85}$ and having an absorption spectrum such as illustrated in FIG. 6. System 80 includes vertical cavity surface-emitting laser (VCSEL) 81, here an aluminum-gallium-arsenide (AlGaAs) continuous-wave laser. Laser 81 is in operable communication with laser diode (LD) temperature controller 82 and laser diode (LD) current controller 83. LD temperature controller 82 maintains laser 81 at a substantially constant temperature, and LD current controller 83 adjusts the driver current provided to laser 81 so as to modify the output wavelength ω$_L$ of laser 81 as desired. Lock-in amplifiers (LIAs) (1) and (2), denoted in FIG. 8 as elements 84 and 85 respectively, generate a modulation signal $v_m$ sin(f$_m$t), where $v_m$ is an amplitude of the modulation signal, f$_m$ is a frequency of the modulation signal, and t is time. The modulation signal is provided to LD current controller 83, which modulates the driver current of laser 81 responsive to the signal, causing the laser frequency to oscillate about ω$_L$ with frequency f$_m$ and amplitude $v_m$. Beamsplitter 86 splits the modulated laser beam into two beams, which were passed through first and second cylindrical, Pyrex transmission cells 87, 88. The first cell 87 is maintained at room temperature, and contains a mixture of Rb$^{87}$ and 1 torr of nitrogen (N$_2$), with up to 2% residual Rb$^{85}$ as described in greater detail above. The second cell 88 is maintained at an elevated temperature, and contains Rb$^{87}$ with up to 1% residual Rb$^{85}$. The irradiance of laser light through cells 87, 88 is respectively detected with Si photodiodes 89, 90, the outputs of which are respectively provided to lock-in amplifiers (LIAs) 84, 85. The outputs of LIAs 84, 85 (i.e., the error signals from photodiodes 89, 90) are provided to a Labview data acquisition (DAQ) module, which generates plots of the error signals as a function of time for the laser light transmitted through cells 87, 88. The output of LIA 85 is also provided to a Proportional-Integral (PI) control module 93 that is in operable communication with LD current controller 83 and generates signals instructing the current controller to adjust the driver current so as to vary the laser frequency ω$_L$ based on the amplitude of the error signal from LIA 85, e.g., based on the deviation of ω$_L$ from the frequency of the isoclinic point.

Figure 9A:
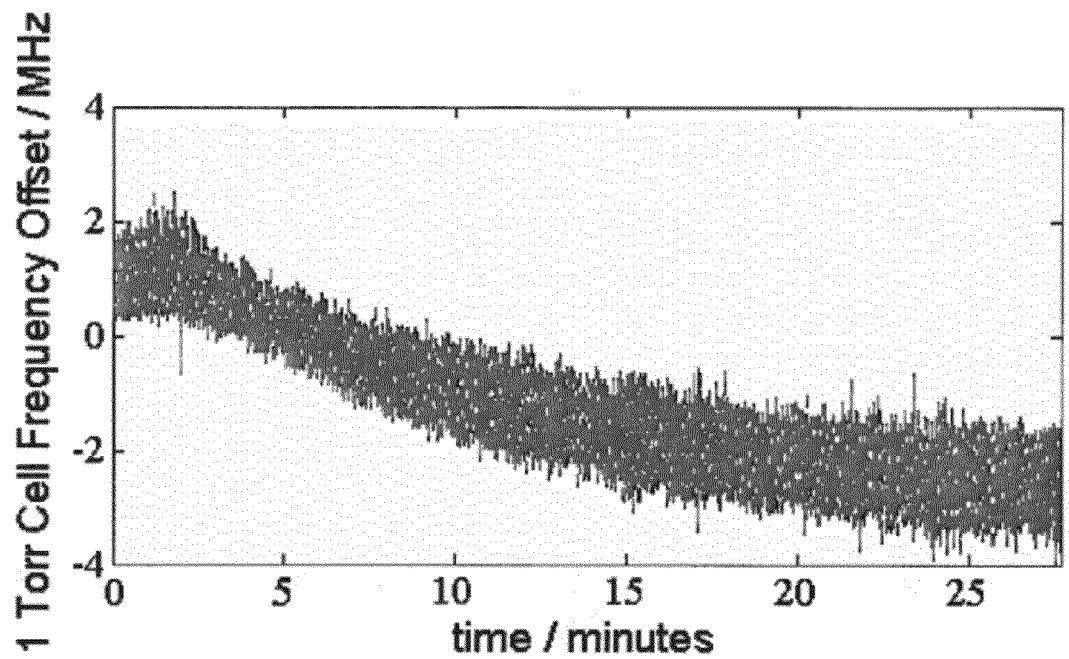
FIG. 9A is a plot of the measured frequency change as a function of temperature for the 4.6 GHz peak in the absorption spectrum of FIG. 2B, obtained using the experimental setup of FIG. 8.

FIG. 9A shows the results of a first experiment in which the laser frequency ω$_L$ was locked to the maximum of absorption peak D illustrated in FIG. 2B. As mentioned above, this peak would be expected to be the least affected by temperature variations of the four peaks illustrated in FIG. 2B, because peak D overlaps to a relatively small extent with absorption peak C and therefore would experience less pulling as a function of temperature. In this experiment, the temperature of the Rb-only cell 88 was varied between an initial temperature of 43° C. (at a time of t=0) and a final temperature of room temperature, approximately 25° C. (at a time of approximately t=28 minutes). The y-axis in FIG. 9A, "1-Torr Cell Frequency Offset/MHz," refers to the difference between the error signals output from LIA 84 and LIA 85, as determined by Labview DAQ module 92. This difference may be used as a measure of the frequency of laser 81. Specifically, cell 84 acted as a frequency discriminator; because laser 81 excited the same transition in cells 84, 85, the output of LIA 84 was proportional to the frequency difference in that absorption feature between the two cells. Note, however that because cell 87 also contained 1 torr of $N_2$, which is known to cause a pressure shift in the $Rb^{87}$ $D_1$ transition of approximately 7 MHz/torr, the error signal from this cell was non-zero when laser 81 was locked to any of the gas absorption features. As can be seen in FIG. 9A, the frequency of laser 81 varies by approximately 3 MHz over the experimental temperature range. The temperature sensitivity of peak D is estimated to be approximately 200 kHz/° C. over the experimental temperature range.

Figure 9B:
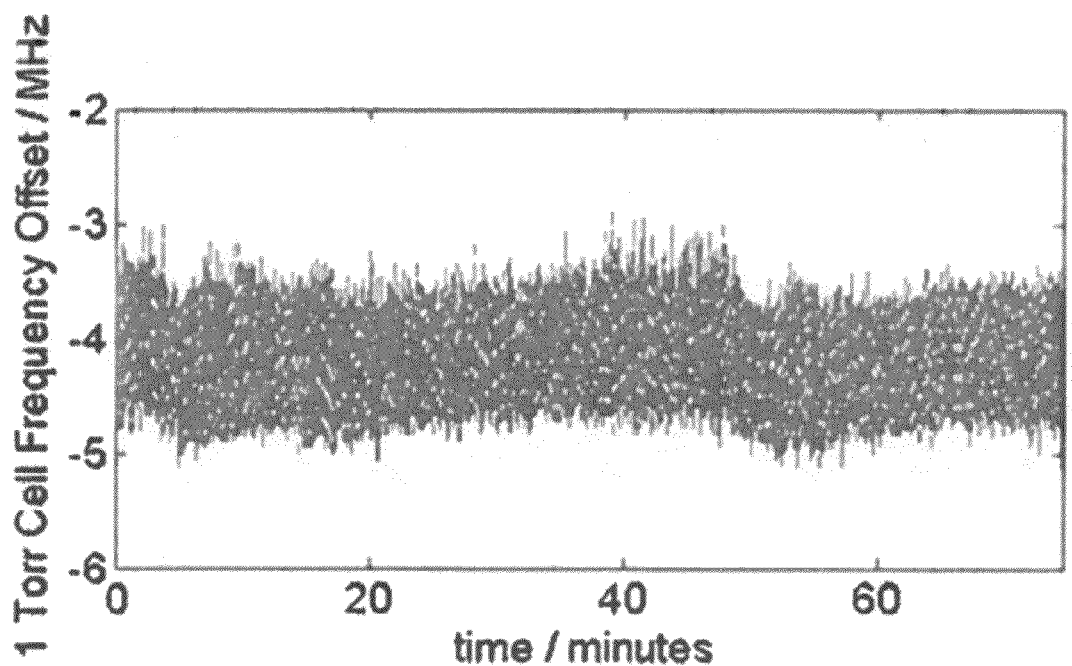
FIG. 9B is a plot of the measured frequency change as a function of temperature for the isoclinic point in the absorption spectrum of FIG. 6, obtained using the experimental setup of FIG. 8, according to some embodiments of the present invention.

The same experiment was repeated, but instead locking the laser frequency $\omega_L$ to isoclinic point 42 illustrated in FIG. 4. The temperature of cell 88 was again increased to 43° C. and allowed to cool to room temperature. FIG. 9B illustrates the results of this experiment, in which it can be seen that there is no perceptible change in the frequency of laser 81. Based on these results, the temperature sensitivity of isoclinic point 42 is estimated to be less than or equal to 25 kHz/° C., significantly lower that that for peak D. Note that the estimated temperature sensitivity of the isoclinic point is limited in this case by experimental error. Specifically, the calibrated output of LIA 84 merely provides an upper bound on the temperature sensitivity of any absorption feature in the $D_1$ $Rb^{87}$ spectrum, including that of the isoclinic point 42. Calibration of the output of LIA 84 was obtained by tuning the laser frequency and measuring the output of LIA 84 under open-loop conditions. The temperature sensitivity of isoclinic point 42 may be more accurately characterized using additional experiments.

Figure 10:
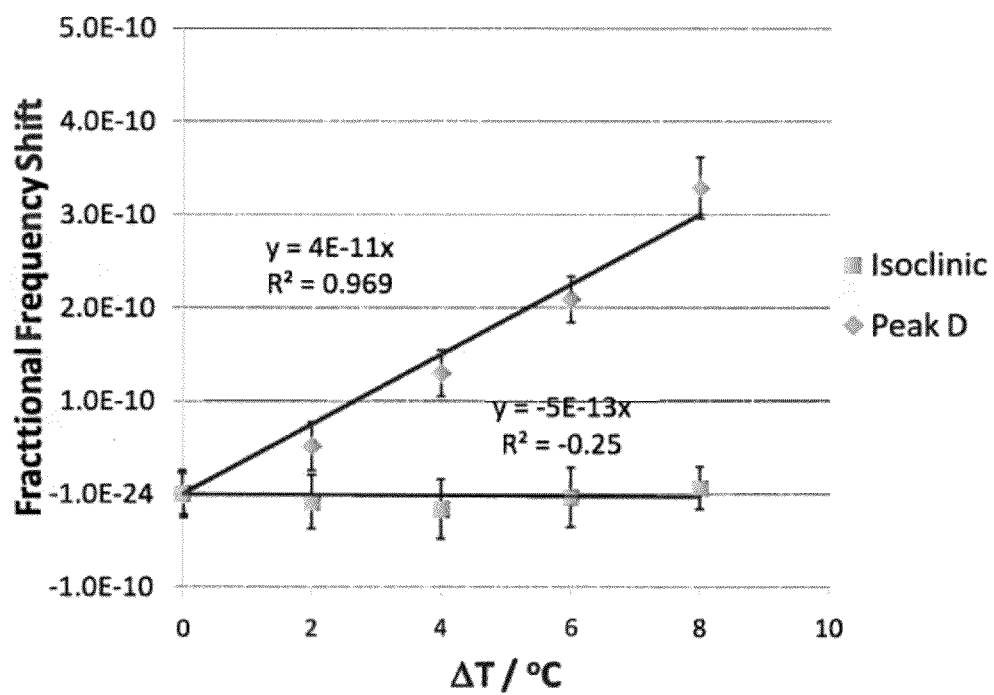
FIG. 10 is a plot of the fractional frequency shift as a function of the temperature for the 4.6 GHz peak in the absorption spectrum of FIG. 2B and for the isoclinic point in the absorption spectrum of FIG. 6, obtained using the experimental setup of FIG. 8, according to some embodiments of the present invention.

For example, a similar experiment as above was used to more accurately determine the temperature sensitivity of both peak D and isoclinic point 42. The experiment used the same setup shown in FIG. 8, except cell 87 was replaced with a cell identical to cell 88. That is, both cells 87 and 88 contained $Rb^{87}$ with up to 1% residual $Rb^{85}$. The temperature of cell 88 was raised from 25° C. to 31° C. in 2° C. steps, with enough time between temperature steps to equilibrate the temperature of cell 88. After the equilibration period, the difference between the error signals output from LIA 84 and LIA 85 was recorded by Labview DAQ module 92 for 100 seconds. This difference may be used as a measure of the frequency of laser 81 using calibrations obtained under open-loop conditions. This process was repeated for each temperature step. The results of this experiment are illustrated in FIG. 10, where the shift in the fractional frequency ($y \cong \delta\omega/\omega_o$) of laser 81 is shown as a function of temperature of cell 88. The slope of the data in FIG. 10 can be used to estimate the temperature sensitivity ($\delta y/\delta T$). For the isoclinic point 42, the temperature sensitivity is estimated to be less than or equal to $1 \times 10^{-12}/°C$. For peak D, the temperature sensitivity is estimated to be $4 \times 10^{-11}/°C$.

Alternative Embodiments

While preferred embodiments of the invention are described herein, it will be apparent to one skilled in the art that various changes and modifications may be made. The appended claims are intended to cover all such changes and modifications that fall within the true spirit and scope of the invention.

What is claimed:

1. A system for stabilizing the frequency of a tunable-frequency laser, the system comprising:
   a transmission cell containing a substance and configured to transmit light from the laser, the substance having an absorption spectrum including first and second peaks respectively corresponding to first and second transitions of the material, the first and second peaks overlapping with one another, a point in the overlap between the first and second peaks defining an isoclinic point of the absorption spectrum, the isoclinic point being a frequency at which a first derivative of the absorption spectrum of the substance substantially does not change upon a chemical reaction or physical change of the substance;
   a photodiode configured to generate an output based on an amplitude of laser light transmitted through the cell; and
   circuitry configured to lock the frequency of the laser to the isoclinic point of the absorption spectrum based on the output.

2. The system of claim 1, wherein the isoclinic point is a saddle point between the first and second peaks.

3. The system of claim 1, wherein the first and second peaks have substantially equal amplitude as one another.

4. The system of claim 3, wherein the first and second peaks broaden substantially equally as each other as a function of a physical parameter of the substance.

5. The system of claim 4, wherein the physical parameter comprises temperature or pressure.

6. The system of claim 1, wherein the substance comprises an atomic gas and wherein the first and second transitions are electronic transitions of atoms in the gas.

7. The system of claim 6, wherein the atomic gas comprises an alkali selected from the group consisting of $Rb^{87}$, $Li^7$, $Na^{23}$, $K^{39}$, and $^{41}K$.

8. The system of claim 1, wherein a fractional frequency of the isoclinic point varies by about $10^{-12}$ or less per degree Celsius.

9. The system of claim 1, wherein the circuitry comprises:
   a lock-in amplifier configured to receive the output of the photodiode and to generate an error signal based on the output; and
   a controller in operable communication with the laser and the lock-in amplifier, the controller configured to tune the frequency of the laser so as to minimize the error signal.

10. The system of claim 9, wherein the controller tunes the frequency of the laser by adjusting a driver current of the laser.

11. A method of stabilizing the frequency of a tunable-frequency laser, the method comprising:
    transmitting light from the laser through a cell containing a substance, the substance having an absorption spectrum including first and second peaks respectively corresponding to first and second transitions of the substance, the first and second peaks overlapping with one another, a point in the overlap between the first and second peaks defining an isoclinic point of the absorption spectrum, the isoclinic point being a frequency at which a first derivative of the absorption spectrum of the substance substantially does not change upon a chemical reaction or physical change of the substance;
    measuring an amplitude of the laser light transmitted through the cell; and based on the measured amplitude, locking the frequency of the laser to the isoclinic point of the absorption spectrum.

12. The method of claim 11, wherein the isoclinic point is a saddle point between the first and second peaks.

13. The method of claim 11, wherein the first and second peaks have substantially equal amplitude as one another.

14. The method of claim 13, wherein the first and second peaks broaden substantially equally as each other as a function of a physical parameter of the substance.

15. The method of claim 14, wherein the physical parameter comprises temperature or pressure.

16. The method of claim 11, wherein the substance comprises an atomic gas and wherein the first and second transitions are electronic transitions of atoms in the gas.

17. The method of claim 16, wherein the atomic gas comprises an alkali selected from the group consisting of $Rb^{87}$, $Li^7$, $Na^{23}$, $K^{39}$, and $K^{41}$.

18. The method of claim 11, wherein a fractional frequency of the isoclinic point varies by about $10^{-12}$ or less per degree Celsius.

19. The method of claim 11, wherein measuring the amplitude of the laser light comprises receiving the transmitted laser light with a photodiode and generating an error signal based on the output with a lock-in amplifier.

20. The method of claim 19, wherein tuning the frequency of the laser comprises adjusting a driver current of the laser.

* * * * *